United States Patent
Liu et al.

(10) Patent No.: US 7,525,460 B1
(45) Date of Patent: Apr. 28, 2009

(54) TIMING LOOP BASED ON ANALOG TO DIGITAL CONVERTER OUTPUT AND METHOD OF USE

(75) Inventors: Jingfeng Liu, Longmont, CO (US);
Mats Oberg, Cupertino, CA (US);
Zachary Keirn, Loveland, CO (US);
Bin Ni, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/775,757

(22) Filed: Jul. 10, 2007

Related U.S. Application Data

(60) Provisional application No. 60/830,628, filed on Jul. 13, 2006.

(51) Int. Cl.
*H03M 1/10* (2006.01)
(52) U.S. Cl. ................................ 341/120; 341/155
(58) Field of Classification Search .............. 341/120, 341/155; 714/731; 375/355
See application file for complete search history.

(56) References Cited

U.S. PATENT DOCUMENTS

| | | | |
|---|---|---|---|
| 4,527,145 A * | 7/1985 | Haussmann et al. ......... 348/537 |
| 5,877,816 A * | 3/1999 | Kim ............................ 348/526 |
| 7,023,941 B1 * | 4/2006 | Rey et al. .................... 375/355 |
| 7,178,093 B2 * | 2/2007 | Chen et al. ................... 714/796 |
| 2002/0145680 A1 * | 10/2002 | Hong .......................... 348/725 |

OTHER PUBLICATIONS

Blu-Ray Disc Association; 1. A Physical Format Specification for BD-RE, 2nd Edition, Feb. 2006.

IEEE Transactions on Communications, vol. 50, No. 12, Dec. 2002; Modeling and Compensation of Asymmetry in Optical Recording, Haralampos Pozidis, Member, IEEE, Jan W. M. Bergmans, Senior Member, IEEE, and Wim M. J. Coene.

A Linearly Constrained Adaptive FIR Filter for Hard Disk Drive Read Channels, pp. 1613-1617, 1997; Li Du, Mark Spurbeck, Richard T. Behrens, Cirrus Logic, Colorado, 305 Interlocken Pkwy, Broomfield, CO 80021.

Effects of Limit Equalizer in Blu-Ray Disc Format, Hideki Kobayashi, Hiroki Kuribayashi, Yoshimi Tomita, and Seiichi Ohsawa.

* cited by examiner

*Primary Examiner*—Peguy JeanPierre

(57) ABSTRACT

A device and process to compensate for asymmetrical qualities of an analog input signal, if present, and generate a timing signal. The timing signal is then used for analog to digital conversion.

52 Claims, 18 Drawing Sheets

TIMING LOOP BASED ON ANALOG TO DIGITAL CONVERTER OUTPUT AND METHOD OF USE

CROSS-REFERENCE TO RELATED APPLICATIONS

This application claims priority under 35 U.S.C. §119(e) to provisional U.S. Patent Application No. 60/830,628, filed on Jul. 13, 2006, the disclosure of which is expressly incorporated by reference herein in its entirety.

BACKGROUND OF THE INVENTION

1. Field of the Invention

The invention is directed generally to a timing loop based on analog to digital converter output and method of use that provides better timing and/or timing recovery, and more particularly, to a timing loop based on analog to digital converter output and method of use for timing and/or timing recovery that is particularly advantageous for use with optical storage devices.

2. Related Art

In order to generate a timing signal and/or timing recovery signal, such as a read channel clock for the read channel of an optical storage device, conventional Phase Detector (PD) uses the output of a filter arranged downstream of the ADC output, such as a finite impulse response (FIR) filter, as a basis for the generation of the timing signal. Such an arrangement produces inferior performance because the output of the filter, which is used to provide signal equalization to the output of the ADC, causes the timing signal to be compromised. In particular, the filter causes a phase shift in the timing and/or timing recovery signal. This is based, in part, on the fact that the filter is designed predominantly to be adaptive to the density variation of the optical storage device and to focus offsets or other errors of the device or media that require a change in the equalization and the like. Moreover, the filter is designed with a partial response target to improve the performance of a detector circuit such as a Viterbi circuit. Thus, these two design criteria drive the timing signal to have a change in phase as noted above. Accordingly, it is difficult to design a filter, such as a FIR filter, that is well constrained to meet multiple diverse demands.

Additionally, the use of ADCs to read an optical storage device, such as a CD, DVD, HD DVD or Blu-Ray disc, also suffers from manufacturing defects common with the stamping process in the manufacture thereof, or writing of recordable media. Such defects include, for example, variations in pit size and the like. These defects may result in high and low amplitudes that are not equal. The defects may also cause the transitions between land and pit to be shifted. In particular, non-linearity defects cause a deterioration of the performance of the timing loop in the optical storage devices.

Accordingly, it would be desirable to provide an improved timing and/or timing recovery circuit, which is particularly suited for use with optical storage devices.

SUMMARY OF THE INVENTION

The invention provides a circuit and method that generates a timing or timing recovery signal responsive to the output of the ADC that does not suffer from the drawbacks and disadvantages noted above, including changes in phase of other device components. Moreover, the invention may provide for compensation in the non-linearity and/or asymmetrical signal qualities, such as those related to defects in optical storage devices. Other more specific aspects of the invention include the use of a slicer bias loop to compensate for the asymmetry present in an ADC output and passing the asymmetry compensated ADC output through a limit equalizer, which may have a novel design that saves a 0.5T phase rotator in a phase detector and a bias error detector.

The invention may be implemented in a number of ways. According to one aspect of the invention a circuit includes an analog to digital converter (ADC) to receive an analog input signal and convert the analog input signal into a digital output signal, a timing generation and compensation circuit responsive to the digital output signal to compensate for asymmetrical qualities of the analog input signal, if present, and generate a timing signal for the ADC, and a filter responsive to the digital output signal to generate a filtered signal.

The timing generation and compensation circuit may include a slicer bias loop that compensates for the asymmetrical qualities present in the digital output signal. The slicer bias loop may include a bias error detector and outputs to a first combiner. The first combiner may include a summer and the slicer bias loop further may include a loop filter. The circuit may further include a slicer, and the bias error detector may include a phase shifting circuit responsive to an output of the first combiner and a transition detector responsive to an output of the slicer. The slicer is responsive to the first combiner. The bias error detector further may include a second combiner combining the output of the phase shifting circuit and a transition detection circuit. The bias error detector may include a single phase shifter with an absolute value output and a second combiner. The loop filter may include a second combiner and an accumulator. The timing generation and compensation circuit may include a limit equalizer responsive to the first combiner. The timing generation and compensation circuit further may include a slicer responsive to the limit equalizer to determine transitions. The circuit may further include a phase detector responsive to the slicer and the first combiner to detect a phase of the digital output signal. The circuit may further include a loop filter responsive to the phase detector to output the timing signal. The limit equalizer may include first and second branches, the first branch may include a limiter and a booster and the second branch may include a phase rotator and a single delay. The phase detector may include a phase shifter and a combining circuit. The bias error detector may include a phase shifter and a transition detector. The circuit may further include a detector responsive to the filtered signal. The detector may include a viterbi detector. The filter may include a finite impulse response filter.

According to another aspect of the invention a method of generating a timing signal includes the steps of receiving an analog input signal and converting the analog input signal into a digital output signal, compensating for asymmetrical qualities of the analog input signal, if present, and generating a timing signal, and filtering the digital output signal to generate a filtered signal.

The step of compensating further may include detecting a bias error to compensate for asymmetrical qualities present in the digital output signal. The step of compensating further may include loop filtering to compensate for asymmetrical qualities present in the digital output signal. The step of compensating further may include limit equalizing the digital signal to generate an equalized signal and slicing the equalized signal to generate a sliced signal. The step of compensating further may include phase detecting the digital signal and the sliced signal. The step of compensating further may include loop filtering and outputting the timing signal. The method may further include the step of detecting the filtered signal. The step of detecting may include detecting the filtered signal with a viterbi detector. The step of filtering may include filtering the digital output signal with a finite impulse response filter.

In yet another aspect of the invention a circuit includes first means for receiving an analog input signal and converting the analog input signal into a digital output signal, second means, responsive to the digital output signal, for generating and compensating for compensating for asymmetrical qualities of the analog input signal, if present, and for generating a timing signal for the first means, and third means, responsive to the digital output signal, for generating a filtered signal.

The second means may include a slicer bias loop that compensates for the asymmetrical qualities present in the digital output signal. The slicer bias loop may include means for detecting a bias error and first means for combining. The first combining means may include means for summing and the slicer bias loop further may include means for loop filtering. The circuit may further include a slicer, and the means for detecting a bias error may include means, responsive to an output of the first combining means, for phase shifting and means, responsive to an output of the slicer, for detecting transition. The slicer may be responsive to the first combing means. The bias error detecting means further may include a second means for combining the output of the phase shifting means and the transition detecting means. The bias error detecting means may include a single phase shifter with an absolute value output and a second means for combining. The loop filtering means may include a second means for combining and an accumulator. The second means may include a limit equalizer responsive to the first combining means. The second means further may include a slicer responsive to the limit equalizer to determine transitions. The circuit may further include a phase detector responsive to the slicer and the first combining means to detect a phase of the digital output signal. The circuit may further include a loop filter responsive to the phase detector to output the timing signal. The limit equalizer may include first and second branches, the first branch including a limiter and a booster and the second branch including a phase rotator and a single delay. The phase detector may include a phase shifter and a combining circuit. The bias error detector may include a phase shifter and a transition detector. The circuit may further include fourth means for detecting responsive to the filtered signal. The fourth means may include a viterbi detector. The third means may include a finite impulse response filter.

In another aspect of the invention a machine-readable medium includes stored instructions, which, when executed by a processor cause the processor to generate a timing signal the instructions include first instructions for receiving an analog input signal and converting the analog input signal into a digital output signal, second instructions, responsive to the digital output signal, for compensating for asymmetrical qualities of the analog input signal, if present, and for generating a timing signal, and third instructions responsive to the digital output signal for generating a filtered signal.

The second instructions further may include instructions for detecting a slicer bias to compensate for the asymmetrical qualities present in the digital output signal. The second instructions further may include instructions for loop filtering to compensate for asymmetrical qualities present in the digital output signal. The second instructions further may include limit equalizing responsive to the digital signal to generate an equalized signal and slicing the equalized signal to generate a sliced signal. The second instructions further may include phase detecting responsive to the digital signal and the sliced signal. The second instructions further may include filtering and outputting the timing signal. The medium may further include fourth instructions for detecting the filtered signal. The fourth instructions may include detecting with a viterbi detector. The third instructions for filtering may include filtering with a finite impulse response filter.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1:
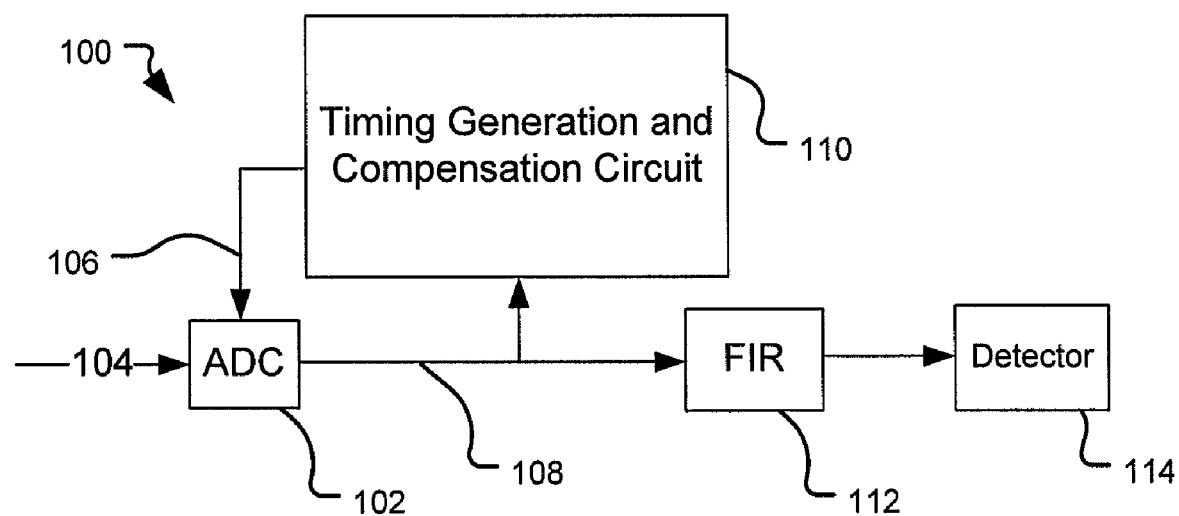
FIG. 1 shows a schematic diagram of an ADC output based timing loop constructed according to the principles of the invention.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

FIG. 1 shows a schematic diagram of an ADC output based timing loop circuit 100 constructed according to the principles of the invention. In particular, FIG. 1 shows an analog to digital converter (ADC) 102 that is used to receive an analog signal and convert it to a digital signal as is well known in the art. As shown in FIG. 1, the ADC 102 receives an analog input 104 such as the PDIC (photo detector IC) from an optical disk storage device (not shown). Additionally, the ADC 102 may receive a timing and/or timing recovery signal, such as a channel clock signal (ADC CLK) 106 that drives the ADC 102 by providing timing and/or timing recovery for the ADC 102. The ADC 102 includes a digital output 108. The digital output 108 is used to generate the timing generation signal ADC CLK 106 by using a timing generation and compensation circuit 110, as described in detail below.

The timing generation and compensation circuit 110 may provide at least two separate functions. The first function is to compensate for the asymmetrical and/or non-linearity of the analog signal received into the analog input 104 such as from an optical storage device. The timing generation and compensation circuit 110 may also be used to provide timing and/or timing error recovery for generation of the ADC CLK 106 signal based on, in part, the phase of the digital output 108. The resultant ADC CLK signal 106 that drives the ADC 102 has improved timing and/or timing recovery. Accordingly, the output of the ADC 102 may be input to a filter 112, such as a finite impulse response (FIR) filter. The filter 112 may then equalize the output of the ADC 102. The output of the filter 112 may be received in a detector 114, such as a Viterbi detector, that may detect the features of the signal thereof.

Accordingly, the FIG. 1 circuit provides improved timing and/or timing recovery to the ADC 102 through the use of the timing generation and compensation circuit 110 when compared to conventional designs in which the timing loop is responsive to the filter output. Thus, the circuit of FIG. 1 decouples the timing loop from filter adaptation, and does not suffer phase distortion that is created by using the filter 112 output as noted above. Moreover, this arrangement is independent of partial response targets. Finally, the timing loop of the circuit 100 experiences less deterioration caused by non-linearity when reading an optical storage device.

Figure 2:
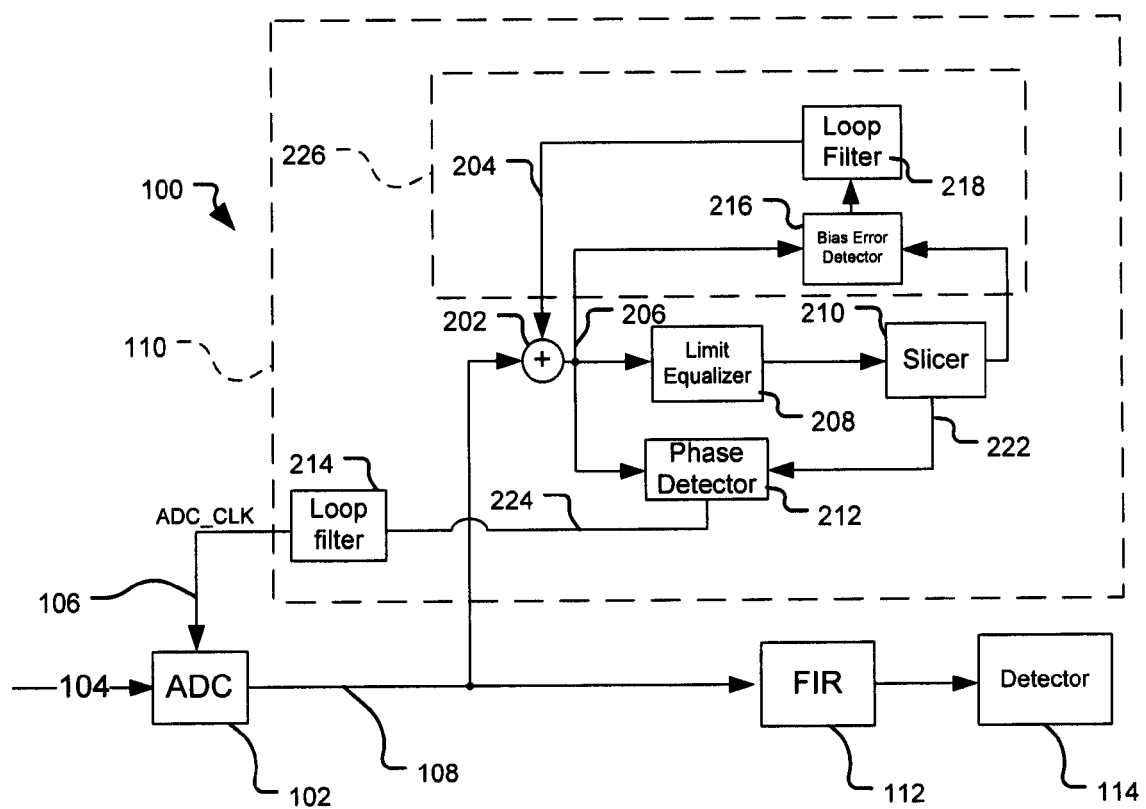
FIG. 2 shows a more specific exemplary implementation of the timing error and compensation circuit of FIG. 1.

FIG. 2 shows a more specific exemplary implementation of the timing error and compensation circuit 110 of FIG. 1. The asymmetry present in the ADC output 108 is compensated by a slicer bias loop 226. The asymmetry compensated output 206 is then equalized by a limit equalizer 208 and passed through a slicer 210 to obtain temporary decisions 222 about channel data from a read channel. The read channel may be a read channel from an optical storage device as is well known in the art. The temporary decisions 222 and the asymmetry compensated output 206 are used as input to the phase detector 212. The phase detector 212 derives the timing error which may be output at 224 and filtered in a loop filter 214. The timing error in turn is used as the error signal for the timing loop (as shown at 106). The individual components of the circuit 110 are discussed in more detail below.

The slicer bias loop 226 includes a bias error detector 216 and a loop filter 218. The bias error detector 216 receives the output of a combiner 202 and the slicer 210. The detector 216 may detect the zero crossing point from the two inputs to determine the bias error. The detector 216 then outputs the bias error to a filter 218 which provides a feedback output to the combiner 202. Thus, the resultant signal from the feedback loop 204 is input to combiner 202 to increase the performance of the timing loop to compensate for the asymmetry or the non-linearity found in, for example, optical storage devices.

The other input to the combiner 202 comes from the output 108 of the ADC 102. Thus, the combiner 202 sums the signal from the ADC 102 with the output from the filter 218 of the slicer bias loop 226. The asymmetry compensated output 206 from the combiner 202 is output to and equalized by the limit equalizer 208. The output of limit equalizer 208 is input to the slicer 210. The slicer 210 has two outputs. The first output of the slicer 210 is input to bias error detector 216, as noted above, and the second output is input to the phase detector 212. The phase detector 212 also receives the asymmetry compensated output 206 from the combiner 202 and generates a timing error signal 224 that is output to a filter 214, which may be a loop filter. The filter 214 smoothes the timing error signal 224 to generate the ADC clock signal 106 to drive the ADC 102. More specific examples of the individual components of the above circuits are set out below.

Figure 3:
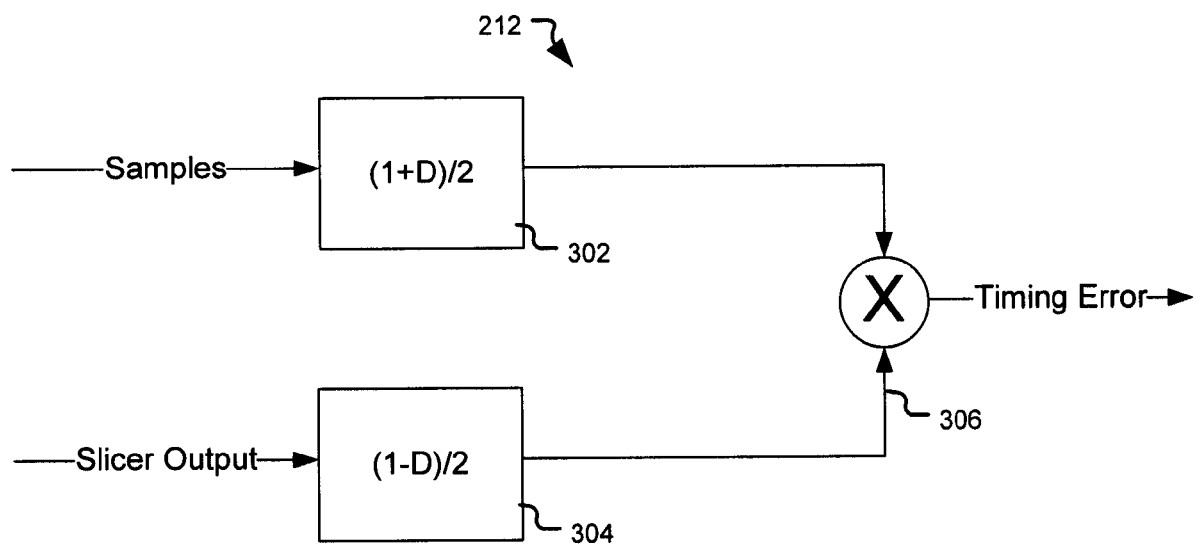
FIG. 3 shows a more specific exemplary implementation of a phase detector for generating timing error, which may be used in the implementation of FIG. 2.

FIG. 3 is a more specific exemplary implementation of the phase detector 212. However, any known arrangement and/or implementation of a phase detector may be employed with the invention. As noted above, the phase detector 212 receives two inputs. The first input is a samples signal, which is the output 206 of the combiner 202 (shown in FIG. 2). The second input to the phase detector 212 is the output from the slicer 210 (shown in FIG. 2). The samples signal 206 is input to a phase shifter 302, which may shift the phase of the samples signal 206 by (1+D)/2 where the component D is the unit delay as is well known in the art. Thus, phase shifter 302 shifts the phase of the signal bit 0.5 T (where T=1/f and f=frequency). When the ADC samples are sampled at peaks, the 0.5T phase shift produces the samples at zero crossing. Filter 304 is used to find the transitions. An output of 0 will indicate that there is no transition. Conversely, a −1 value will be indicative of a negative transition. Finally, a 1 will be indicative of a positive transition. The outputs of the phase shifter 302 and the filter 304 are input to a combining circuit 306, such as a multiplier, as is well known in the art. The resultant output of the combining circuit 306 is the sample values at zero crossing which is used as timing error signal 224 used to drive the ADC clock 106 signal as previously discussed in conjunction with FIG. 2 noted above. The timing error signal 224 may provide an indication of the amount of timing shift that needs to be compensated.

Figure 4:
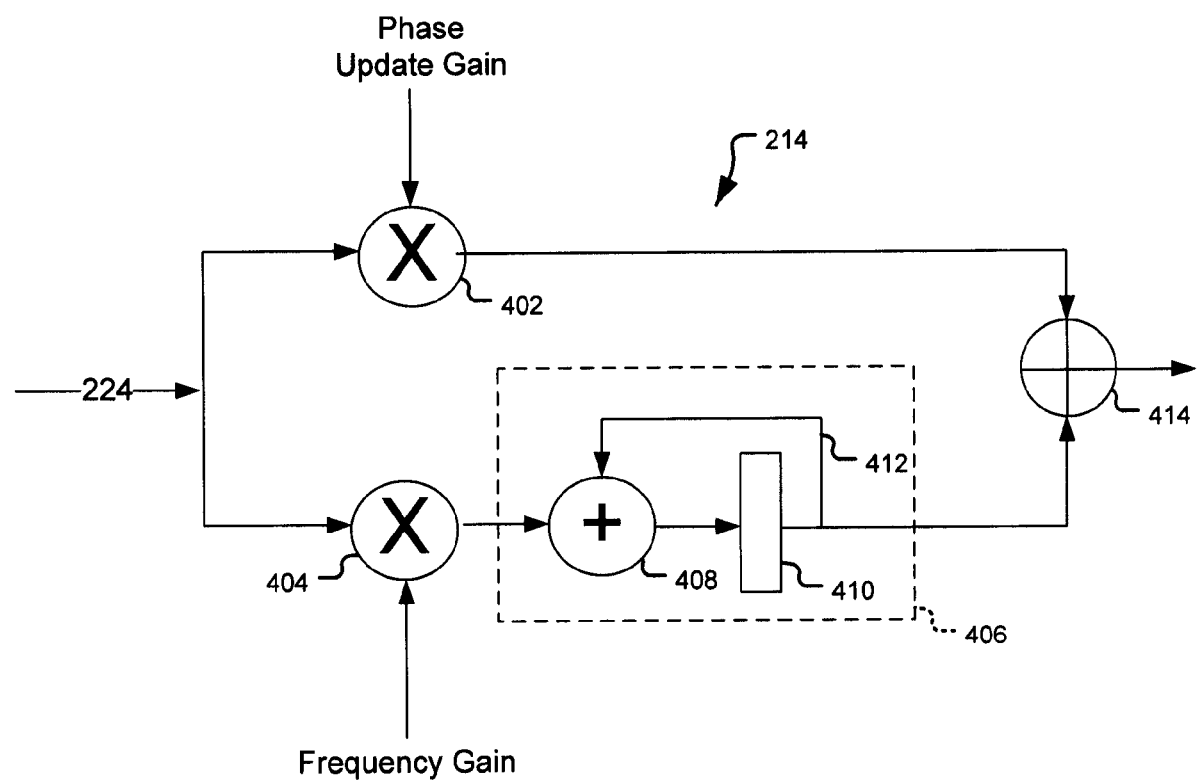
FIG. 4 shows a more specific exemplary implementation of a filter for timing control, which may be used in the implementation of FIG. 2.

FIG. 4 is a more specific exemplary implementation of a timing control filter 214, such as a loop filter, which includes an input 224 from the phase detector 212 shown in FIG. 2. The input 224 to the filter 214 is split into two separate branches for input to a first combining circuit 402, such as a multiplier, and to a second combining circuit 404, such as a multiplier. In particular, the combining circuit 402 may include a phase update gain input and the combining circuit 404 may include a frequency gain input. The filter 214 further includes an accumulator 406 that receives the output from the combining circuit 404. The accumulator 406 may include a combining circuit 408, such as a summing circuit and a delay 410. The output of the delay 410 is fed back along the feedback loop 412 to the combining circuit 408. Moreover, the output of the delay 410 is also fed to a combining circuit 414, such as a summing circuit. The output of the combining circuit 402 may also be fed to the combining circuit 414, whose output is used by VCO (which is not shown here) to generate the ADC clock signal 106 to drive the ADC 102.

Figure 5:
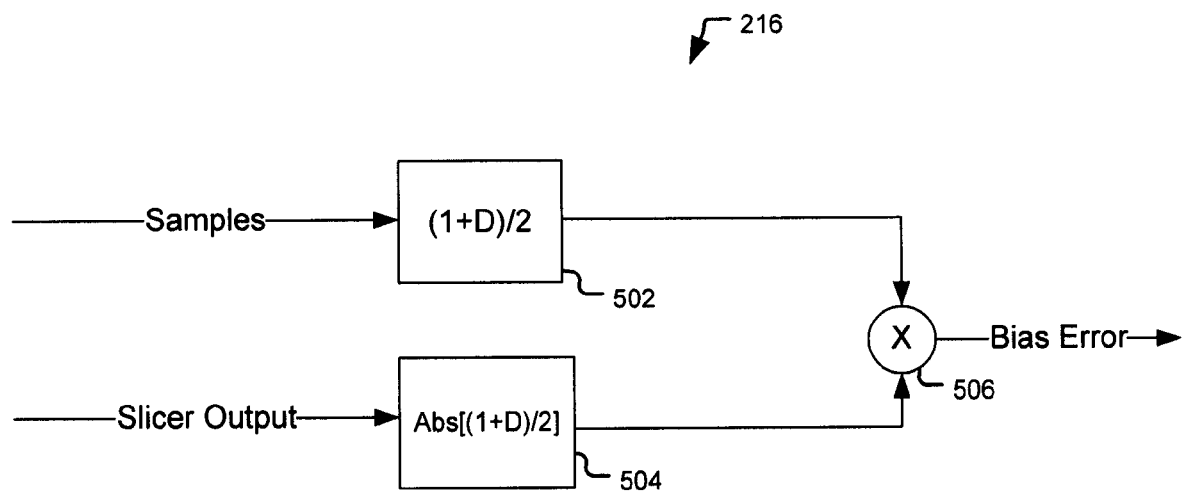
FIG. 5 shows a more specific exemplary implementation of a bias error detector of the invention, which may used in the implementation of FIG. 2.

FIG. 5 is a more specific exemplary implementation of a bias error detector 216. However, it should be noted that any type of bias error detector known in the art may be employed. The bias error detector 216 includes two inputs as noted above. The first samples input is the ADC 106 output that has been compensated for asymmetry, which is received as signal 206 from the combiner 202. This signal is input to a phase shifter 502 of 0.5T that may be used to obtain the sample values at zero crossing point from the ADC samples that are sampled at peaks. The second input to the bias error detector 216 is the output from the slicer 210, which is input to the filter 504. The filter 504 may take the absolute value of a previous transition value of (1−D)/2. The resultant output of the filter 504 may be a 0 indicating no transition or a 1 indicating a transition. The outputs from the phase shifter 502 and filter 504 may be combined in a combining circuit 506, such as a multiplier. The output of the combining circuit 506 is a samples value at zero crossing and may be used to indicate the bias error and may be input to filter 218, as noted above.

Figure 6:
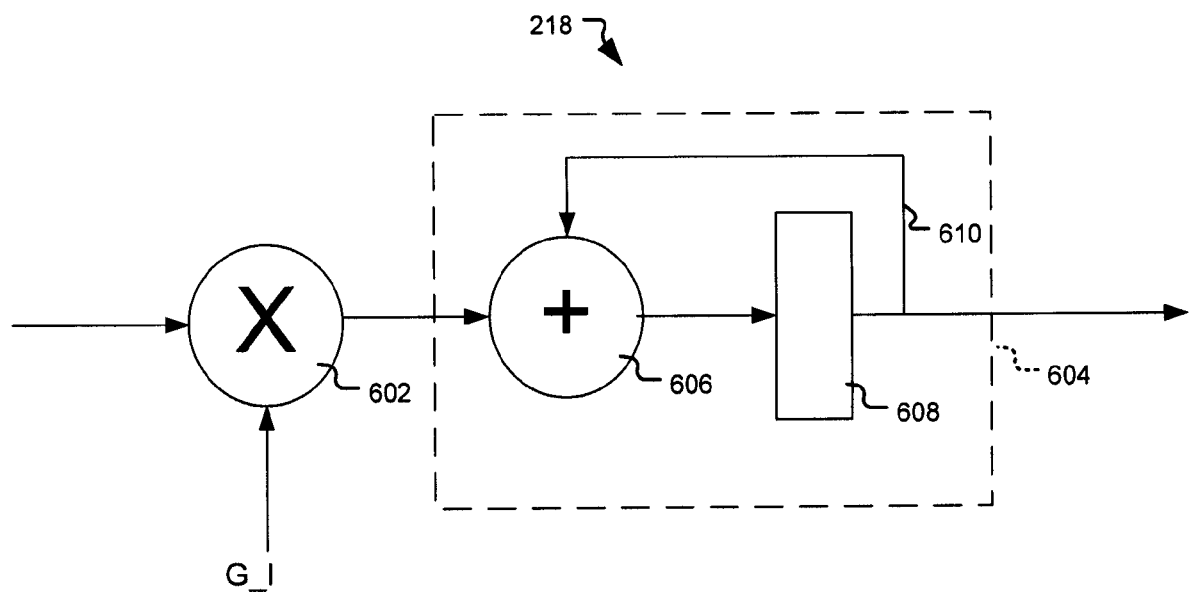
FIG. 6 shows a more specific exemplary implementation of a loop filter configured as an integrating slicer bias loop for a slicer bias control, which may be used in the implementation of FIG. 2.

FIG. 6 is a more specific exemplary implementation of the loop filter 218 configured as an integrating slicer bias loop for slicer bias control. The filter 218 may include a first combiner 602, such as a multiplier, which multiplies the bias error signal, which is the output of detector 216 by a user programmable constant G_I. The resultant output of the combiner 602 is input to an accumulator 604. The accumulator 604 may employ a combiner 606, such as a summing circuit, which outputs to a delay 608 to accumulate the signal magnitude. The output of the delay 608 is fed back along loop 610 back to the combiner 606. However, any type of filter known in the art may be employed in the invention. For example, a Proportional Integral Derivative (PID) slicer bias loop as shown in FIG. 7 may be used in the invention.

Figure 7:
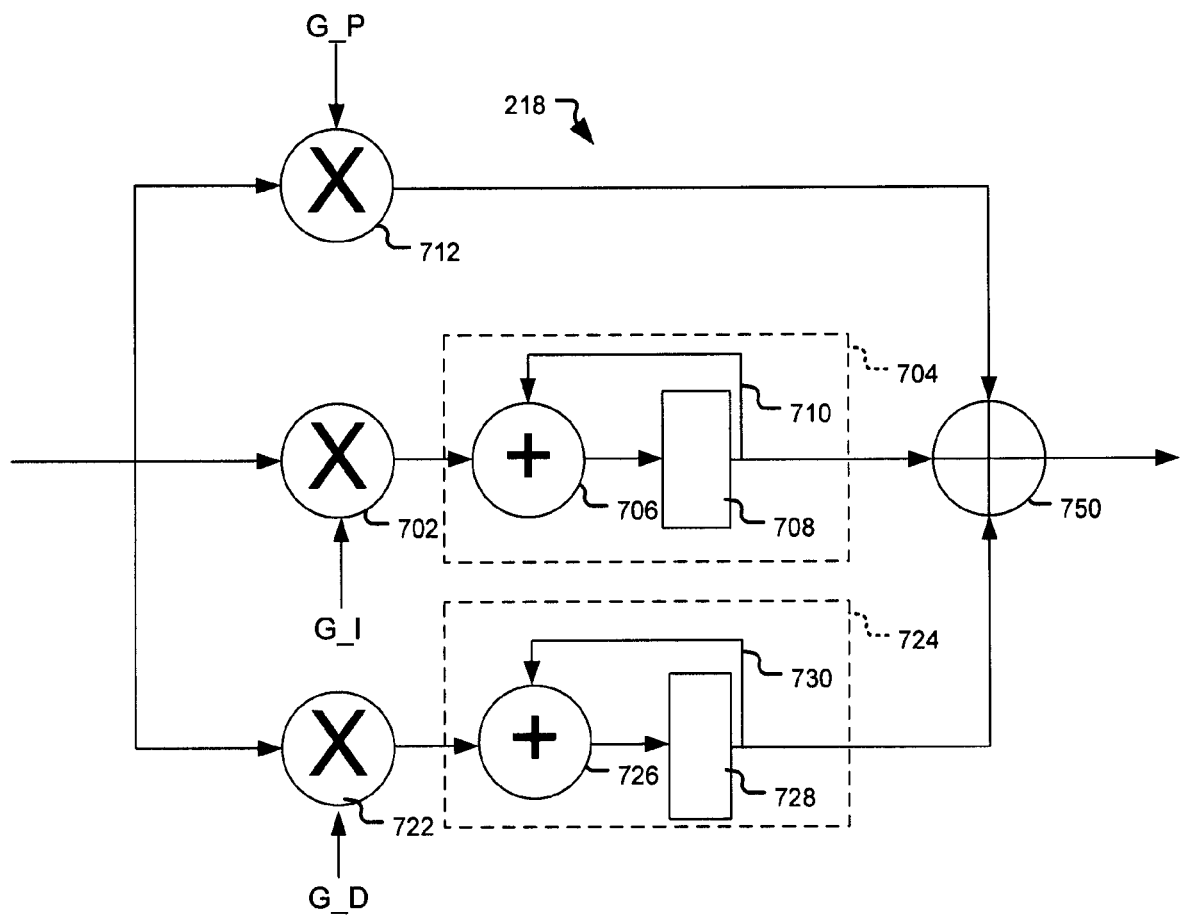
FIG. 7 shows a more specific exemplary implementation of a loop filter Proportional Integral Derivative (PID) slicer bias loop for a slicer bias control, which may be used in the implementation of FIG. 2.

FIG. 7 is a more specific exemplary implementation of a PID slicer bias loop for slicer bias control that may be used as filter 218 in the slicer bias loop 226. In this circuit, the input received from the detector 216 is divided into three separate branches. In the first branch, a combiner 712, which may be a multiplier, combines the output of detector 216 together with a gain of G_P. The G_P is a user programmable constant. The output of the combiner 712 is fed to another combiner 750, which may be a summing circuit that sums the output of all three input branches. The second branch is first fed to a combiner 702, such as a multiplier, together with a gain of G_I. The output of the combiner 702 is fed to an accumulator 704. The accumulator 704 may be implemented with a combiner 706, such as a summing circuit, which outputs to a delay 708 to accumulate the signal. The output delay 708 is fed back via loop 710 back to the combiner 706. The resultant output of the accumulator 704 is input to the combiner 750. Finally, the third input branch may include identical circuits as the second branch, such as multiplier 722 and accumulator 724, except that combiner 726 takes the difference instead of summation. The combiner 750 combines the outputs of all three branches to generate a filtered output. Again, it should be noted that any type of loop filter slicer bias loop may be used in the invention. Moreover, the skilled artisan will appreciate that the FIG. 6 implementation of the loop filter is a special case of the FIG. 7 implementation wherein the G_P and G_D values are set to zero.

Figure 8:
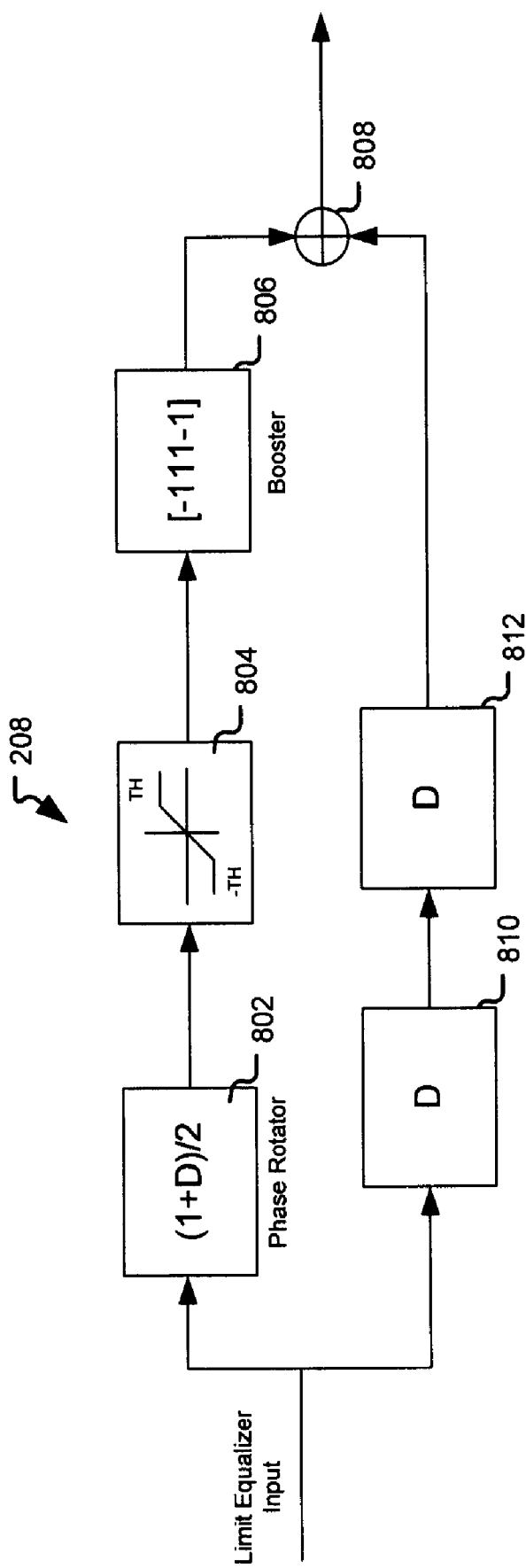
FIG. 8 shows a more specific exemplary implementation of a known limit equalizer, which may be used in the implementation of FIG. 2.

FIG. 8 shows a more specific exemplary implementation of a known construction for a limit equalizer 208. The input of the limit equalizer 208 may be split into an upper branch and a lower branch. The outputs of the upper branch and the lower branch may then be combined. The upper branch of the limit equalizer 208 includes a phase rotator 802, which adjusts the phase of the input signal by (1+D)/2 to shift the phase 0.5T. The output of the phase rotator 802 may be input to a limiter 804. The limiter 804 has a threshold TH, which limits the range of boost of the input signal. Finally, the output of the limiter 804 may be input to a booster 806 which functions to boost the high frequency of the signal. In particular, the booster 806 may include a boost of [−1 1 1 −1]. The output of the booster 806 may be input to a combiner 808, which may be a summing circuit. The lower branch of the limit equalizer 208 is input to a pair of delay circuits 810, 812. The output of the delay circuits 810, 812 is input to the combiner 808 to be combined with the output of the upper branch to provide the limit equalization function. Other limit equalizers besides this design are well known in the art and may be used in addition to or instead of this limit equalizer. Moreover, FIG. 9, discussed below, is an example of a novel limit equalizer of the invention that may be used in the FIG. 2 embodiment.

Figure 9:
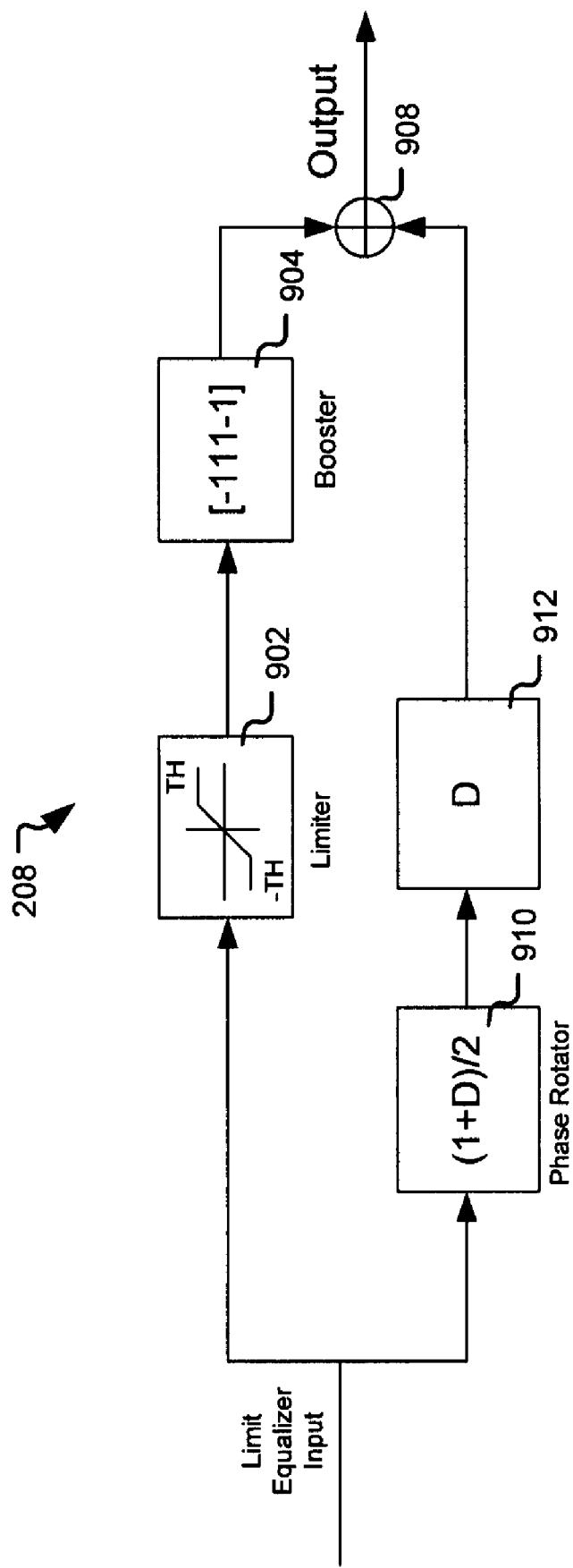
FIG. 9 shows a more specific exemplary implementation of a limit equalizer constructed according to the principles of the invention, which may be used instead of the FIG. 8 equalizer in the implementation of FIG. 2.

FIG. 9 shows another exemplary implementation of a limit equalizer constructed according to the principles of the invention, which may be used in FIG. 2 as a limit equalizer 208. Again, the limit equalizer 208 of FIG. 9 is a two-branch system whose outputs are combined. In particular, the upper branch includes a limiter 902 having a threshold TH. The output of the limiter 902 is input to a booster 904. The limiter 902 and the booster 904 operate in substantially the same manner as that of similar components of FIG. 8. The output of the booster 904 is input to a combiner 908, such as a summing circuit, which sums the outputs of the upper and lower branches. The lower branch includes a phase rotator 910 and a delay 912. The delay 912 and phase rotator 910 operate in substantially the same manner as that of similar components of FIG. 8. The output of delay 912 is input to the combiner 908, whose output is used as the output of equalizer 208. However, the FIG. 9 implementation of the limit equalizer 208 provides a component and/or hardware savings with respect to the FIG. 8 implementation. The lower branch has one less delay than the FIG. 8 implementation and the phase rotator 910 has been moved from the upper branch position into the delay position in the lower branch. Accordingly, less chip space is needed and manufacturing complexity is reduced. Moreover, the hardware savings and reduced circuit complexity can be combined with several other circuits of the invention. As described below, in conjunction with FIG. 10, a phase detector may be used together with the limit equalizer of FIG. 9 with reduced hardware. Similarly, FIG. 11 shows a bias error detector 216 with reduced hardware that can also be used in conjunction with FIG. 9.

Figure 10:
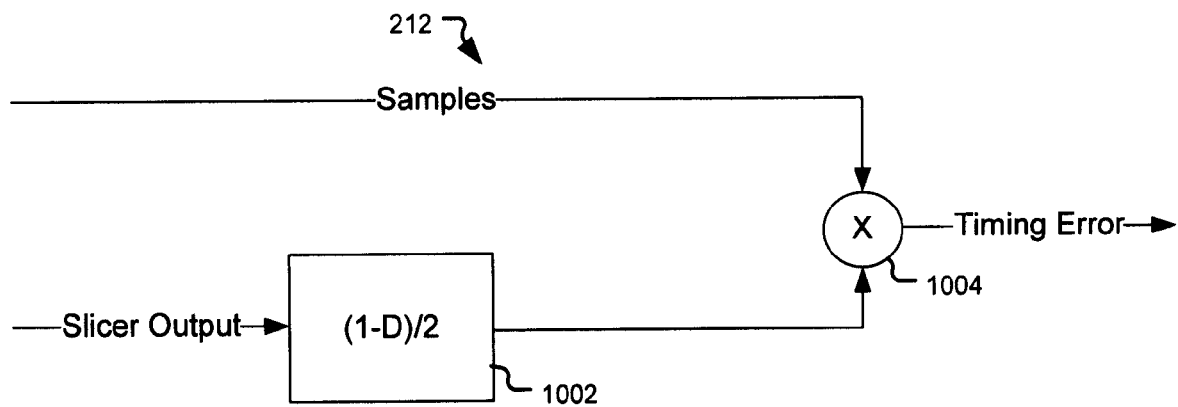
FIG. 10 shows a more specific exemplary implementation of a phase detector of the invention, which may be used with the limit equalizer of FIG. 9.

FIG. 10 shows a more specific exemplary implementation of a phase detector constructed according to the principles of the invention, which may be used with the limit equalizer of FIG. 9. In particular, FIG. 10 shows a phase detector 212 that may be used with the limit equalizer shown in FIG. 9 to reduce the hardware components. The phase detector 212 includes an upper and lower branch. The upper branch of the phase detector 212 receives samples input from the combiner 202, which has the asymmetry compensated output discussed above. This samples input is input to combiner 1004, such as a multiplier. The lower branch of the phase detector 212 receives the output from slicer 210 via slicer output 222 and includes a transition detector 1002. The transition detector 1002 outputs 0 when there is no transition in the slicer output. Conversely, a −1 value will be indicative of a negative transition. Finally, a 1 will be indicative of a positive transition. While any type of phase detector known in the art may be used with this invention, this particular implementation of a phase detector provides a hardware savings when used in conjunction with the FIG. 9 limit equalizer.

Figure 11:
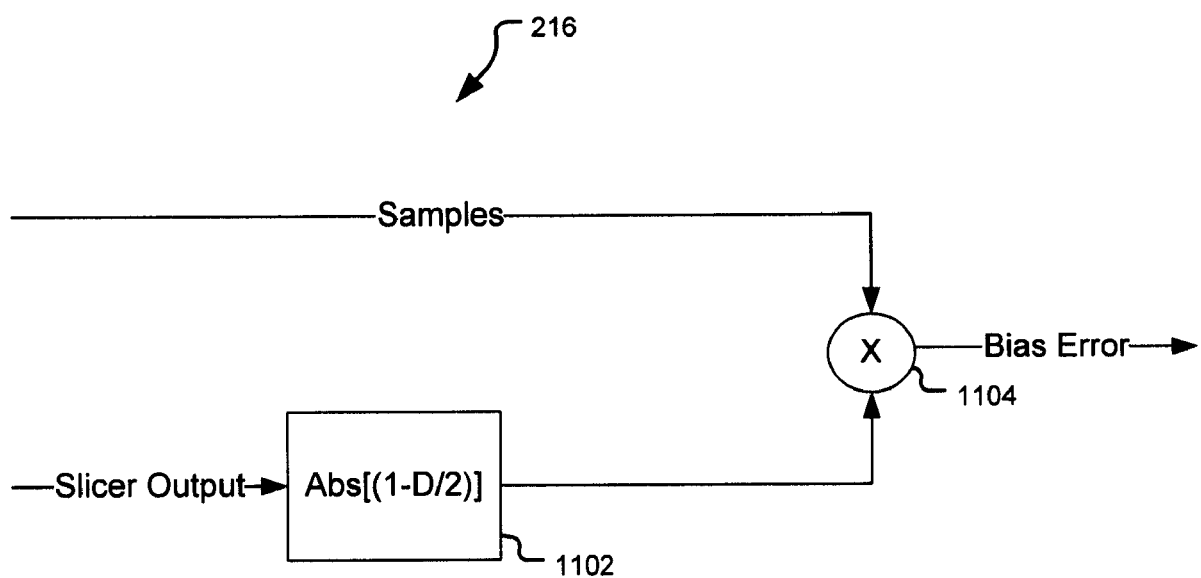
FIG. 11 shows a more specific exemplary implementation of a bias error detector of the invention, which may be used together with the limit equalizer of FIG. 9.

FIG. 11 shows a more specific exemplary implementation of a bias error detector constructed according to the principles of the invention, which may be used together with the limit equalizer of FIG. 9. In particular, a bias error detector 216 as shown in FIG. 11 may be used in conjunction with the limit equalizer of FIG. 9. The bias error detector 216 includes an upper and lower branch. The upper branch of the bias error detector 216 may receive the asymmetry compensated samples input from the combiner 202, which is input directly to a combiner 1104, such as a multiplier. The lower branch of the bias error detector 216 constitutes the slicer output 222 and is input to a transition detector 1102. The transition detector 1102 is used to indicate if the sample value is from a transition or not. This indication may be input to the combiner 1104 whose output is indicative of the bias error from detector 216. The bias error detector 216 of FIG. 11 may be used together with the limit equalizer shown in FIG. 9 to provide a hardware and/or cost savings.

Figure 12:
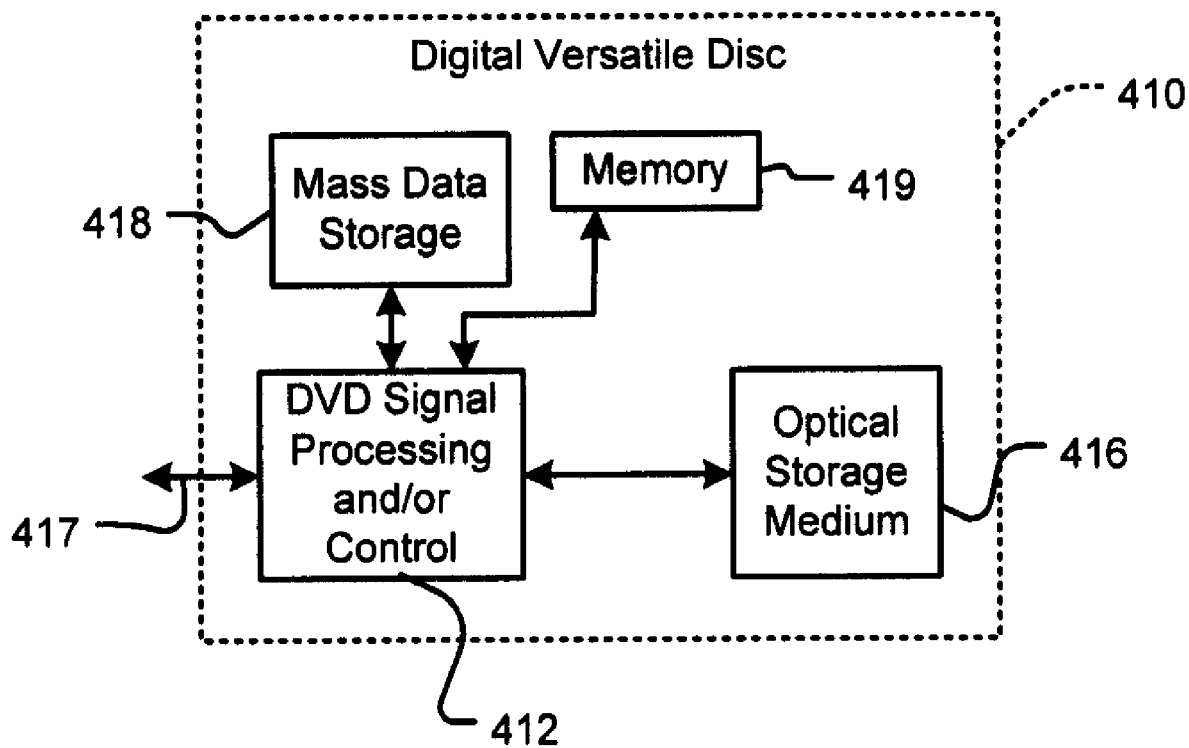
FIGS. 12, 13, 14, 15, 16, 17, and 18 show various exemplary applications for the invention.

Referring now to FIGS. 12, 13, 14, 15, 16, 17, and 18, various exemplary applications of the invention are shown. Referring first to FIG. 12, the invention may be embodied in a digital versatile disc (DVD) drive 411. The invention may implement either or both signal processing and/or control circuits, which are generally identified in FIG. 12 at 412, and/or mass data storage 418 of the DVD drive 411. Signal processing and/or control circuit 413 and/or other circuits (not shown) in the DVD 411 may process data, perform coding and/or encryption, perform calculations, and/or format data that is read from and/or data written to an optical storage medium 416. In some implementations, signal processing and/or control circuit 412 and/or other circuits (not shown) in DVD 411 can also perform other functions such as encoding and/or decoding and/or any other signal processing functions associated with a DVD drive.

DVD drive 411 may communicate with an output device (not shown) such as a computer, television or other device via one or more wired or wireless communication links 417. DVD 411 may communicate with mass data storage 418 that stores data in a nonvolatile manner. DVD 411 may be connected to memory 419, such as RAM, ROM, low latency nonvolatile memory such as flash memory, and/or other suitable electronic data storage.

Figure 13:
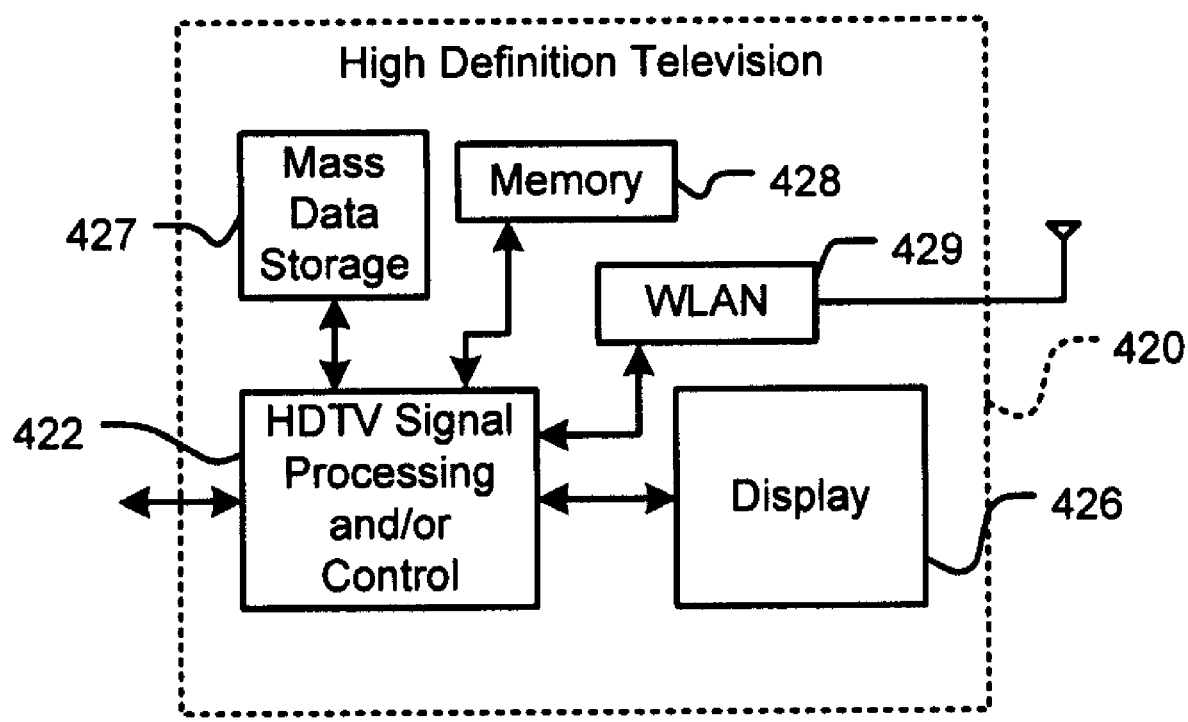

Referring now to FIG. 13, the invention may be embodied in a high definition television (HDTV) 420. The invention may implement either or both signal processing and/or control circuits, which are generally identified in FIG. 13 at 422, a WLAN interface and/or mass data storage of the HDTV 420. HDTV 420 receives HDTV input signals in either a wired or wireless format and generates HDTV output signals for a display 426. In some implementations, the signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with a mass data storage 427 that stores data in a nonvolatile manner such as optical and/or magnetic storage devices. At least one DVD may have the configuration shown in FIG. 12. HDTV 420 may be connected to a memory 428 such as RAM, ROM, low latency nonvolatile memory such as flash memory and/or other suitable electronic data storage. HDTV 420 also may support connections with a WLAN via a WLAN network interface 429.

Figure 14:
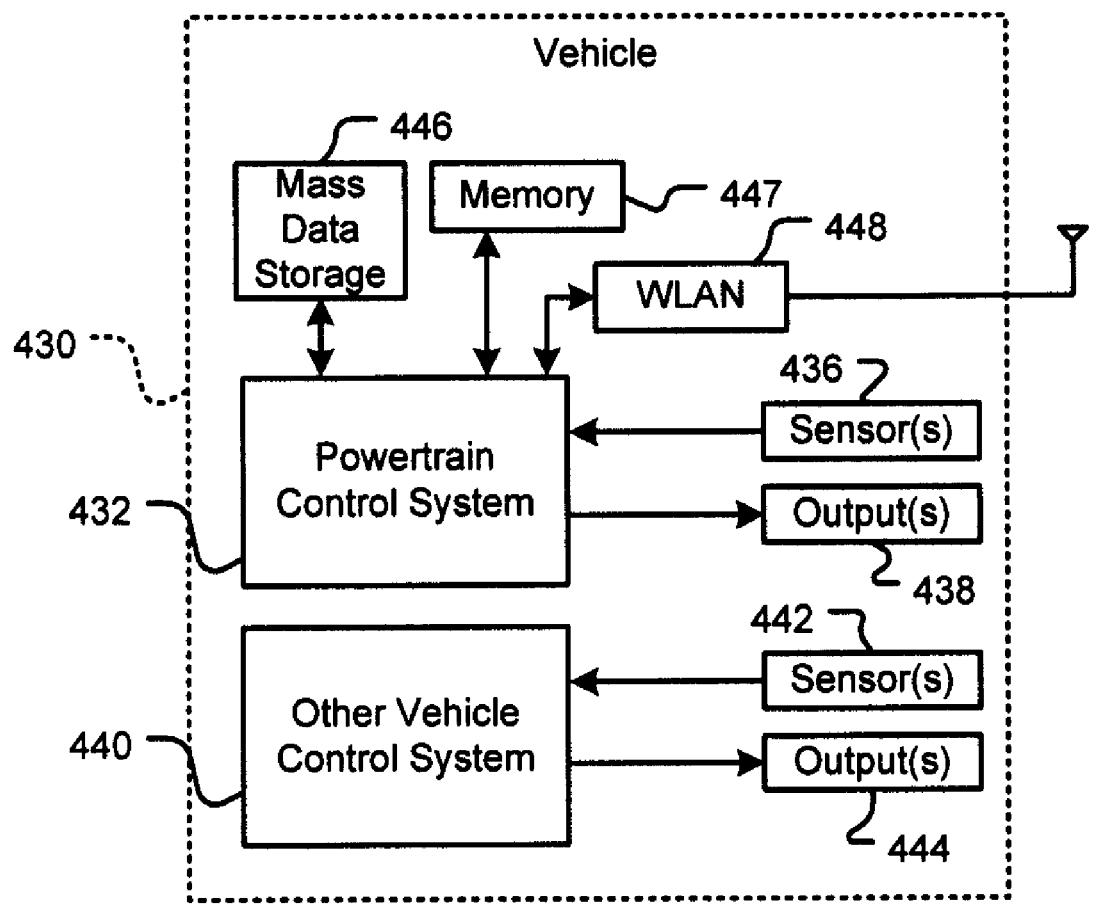

Referring now to FIG. 14, the invention may be implemented in a control system of a vehicle 430, a WLAN interface and/or mass data storage of the vehicle control system. In some implementations, the invention implements a powertrain control system 432 that receives inputs from one or more sensors 436 such as temperature sensors, pressure sensors, rotational sensors, airflow sensors and/or any other suitable sensors and/or that generates one or more output control signals from an output 438 such as engine operating parameters, transmission operating parameters, and/or other control signals.

The invention may also be embodied in other control systems 440 of vehicle 430. Control system 440 may likewise receive signals from input sensors 442 and/or output control signals to one or more output devices 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices for example hard disk drives HDD and/or DVDs. At least one DVD may have the configuration shown in FIG. 12. Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown).

Figure 15:
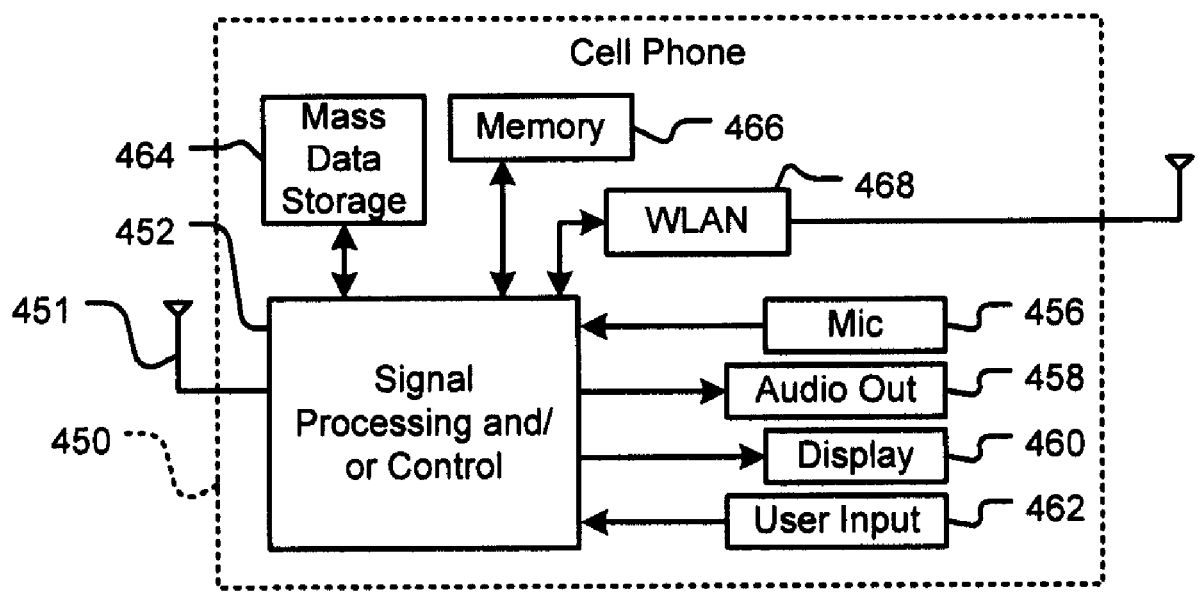

Referring now to FIG. 15, the invention may be embodied in a cellular phone 450 that may include a cellular antenna 451. The invention may implement either or both signal processing and/or control circuits, which are generally identified in FIG. 15 at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with a mass data storage 464 that stores data in a nonvolatile manner such as optical and/or magnetic storage devices for example hard disk drives HDD and/or DVDs. At least one DVD may have the configuration shown in FIG. 12. Cellular phone 450 may be connected to a memory 466 such as RAM, ROM, low latency nonvolatile memory such as flash memory and/or other suitable electronic data storage. Cellular phone 450 also may support connections with a WLAN via a WLAN network interface 468.

Figure 16:
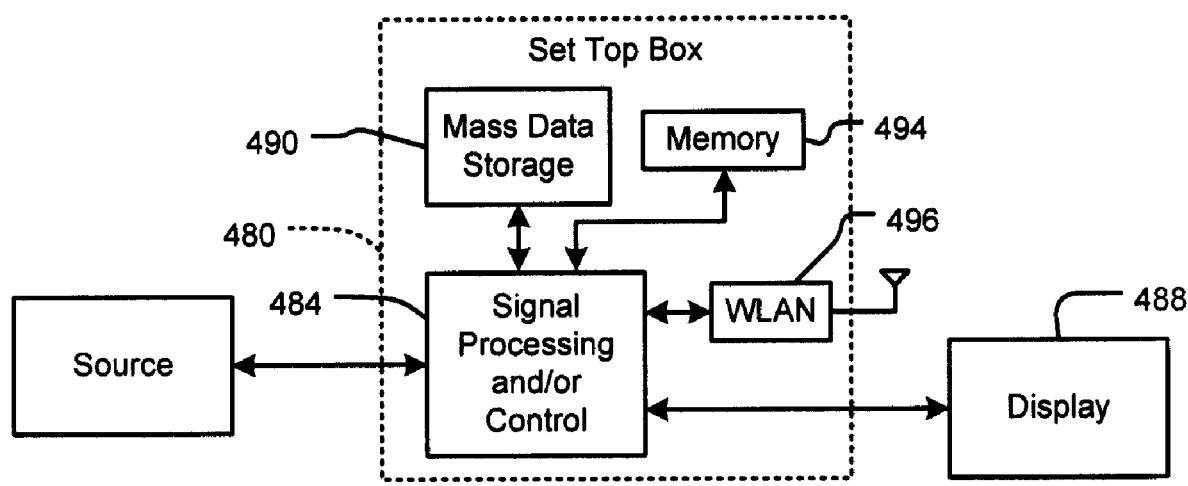

Referring now to FIG. 16, the invention may be embodied in a set top box 480. The invention may implement either or both signal processing and/or control circuits, which are generally identified in FIG. 16 at 484, a WLAN interface and/or mass data storage of the set top box 480. Set top box 480 receives signals from a source such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices for example hard disk drives HDD and/or DVDs. At least one DVD may have the configuration shown in FIG. 12. Set top box 480 may be connected to memory 494 such as RAM, ROM, low latency nonvolatile memory such as flash memory and/or other suitable electronic data storage. Set top box 480 also may support connections with a WLAN via a WLAN network interface 496.

Figure 17:
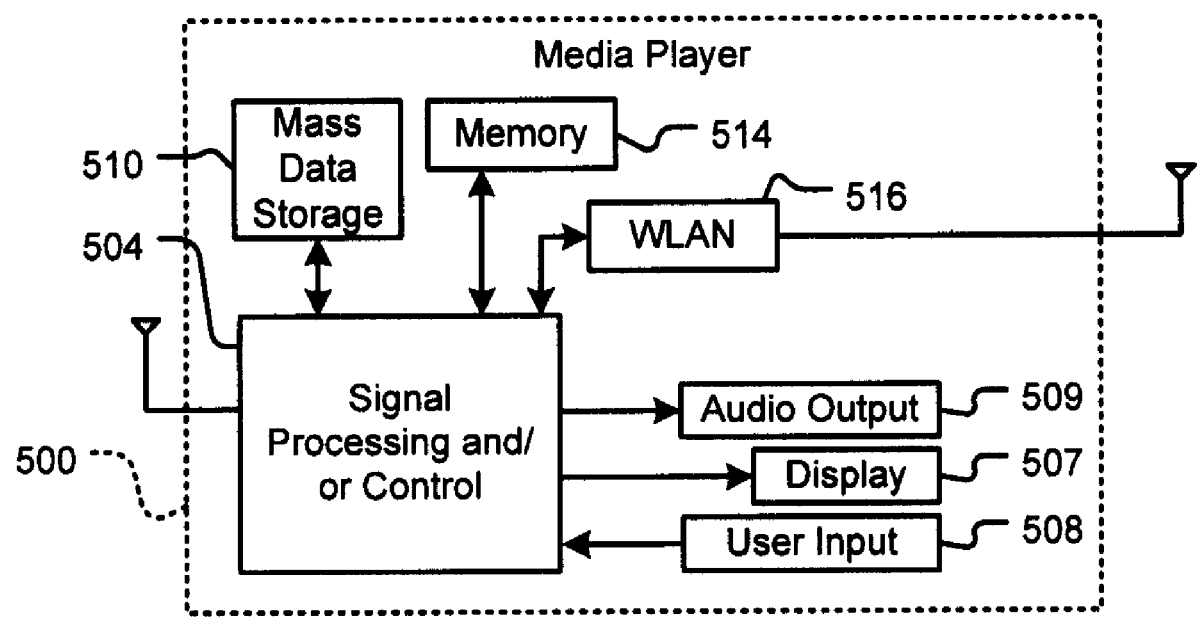

Referring now to FIG. 17, the invention may be embodied in a media player 500. The invention may implement either or both signal processing and/or control circuits, which are generally identified in FIG. 17 at 504, a WLAN interface and/or mass data storage of the media player 500. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuits 511 and/or other circuits (not shown) of media player 500 may process data, perform coding and/or encryption, perform calculations, format data and/or perform any other media player function.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one DVD may have the configuration shown in FIG. 12. Media player 500 may be connected to memory 514 such as RAM, ROM, low latency nonvolatile memory such as flash memory and/or other suitable electronic data storage. Media player 500 also may support connections with a WLAN via a WLAN network interface 516.

Figure 18:
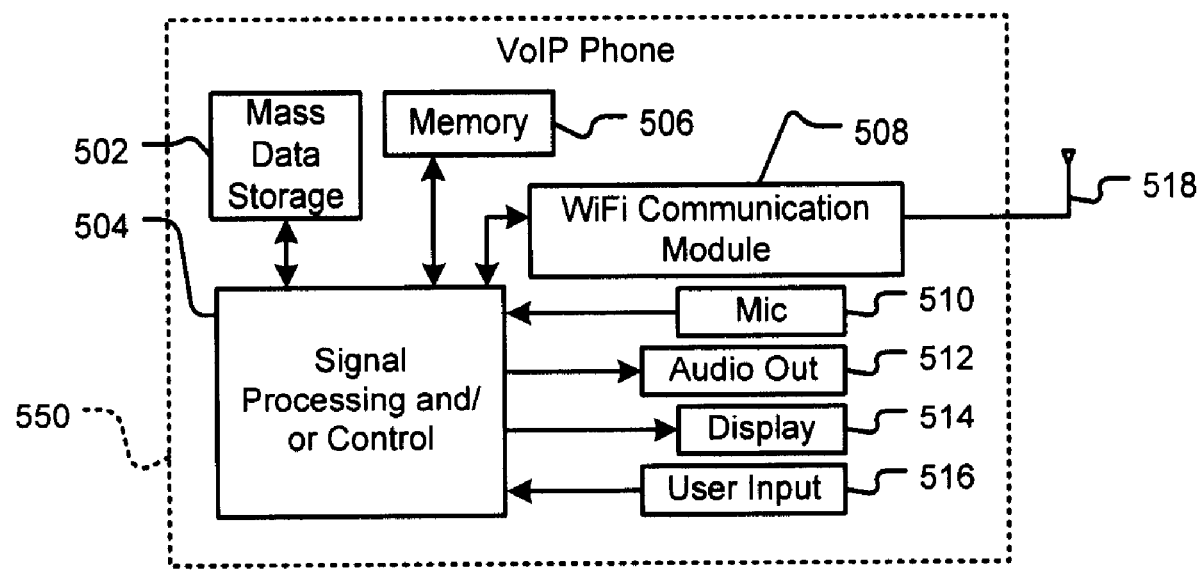

Referring to FIG. 18, the invention may be embodied in a Voice over Internet Protocol (VoIP) phone 550 that may include an antenna 518. The invention may implement either or both signal processing and/or control circuits, which are generally identified in FIG. 18 at 504, a wireless interface and/or mass data storage of the VoIP phone 550. In some implementations, the VoIP phone 550 includes, in part, a microphone 510, an audio output 512 such as a speaker and/or audio output jack, a display monitor 514, an input device 516 such as a keypad, pointing device, voice actuation and/or other input devices, and a Wireless Fidelity (Wi-Fi) communication module 508. Signal processing and/or control circuits 504 and/or other circuits (not shown) in VoIP phone 550 may process data, perform coding and/or encryption, perform calculations, format data and/or perform other VoIP phone functions.

VoIP phone 550 may communicate with mass data storage 502 that stores data in a nonvolatile manner such as optical and/or magnetic storage devices, for example hard disk drives HDD and/or DVDs. At least one DVD may have the configuration shown in FIG. 12. The VoIP phone 550 may be connected to memory 506, which may be a RAM, ROM, low latency nonvolatile memory such as flash memory and/or other suitable electronic data storage. The VoIP phone 550 may be configured to establish communications link with a VoIP network (not shown) via a Wi-Fi communication module 508. Still other implementations in addition to those described above are contemplated.

In accordance with various embodiments of the invention, the methods described herein are intended for operation with dedicated hardware implementations including, but not limited to, semiconductors, application specific integrated circuits, programmable logic arrays, and other hardware devices constructed to implement the methods and modules described herein. Moreover, various embodiments of the invention described herein are intended for operation with as software programs running on a computer processor. Furthermore, alternative software implementations including, but not limited to, distributed processing or component/object distributed processing, parallel processing, virtual machine processing, any future enhancements, or any future protocol can also be used to implement the methods described herein.

It should also be noted that the software implementations of the invention as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the invention is considered to include a tangible storage medium or distribution medium, as listed herein and including art-recognized equivalents and successor media, in which the software implementations herein are stored.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed:
1. A circuit comprising:
an analog to digital converter (ADC) to receive an analog input signal and convert the analog input signal into a digital output signal;
a timing generation and compensation circuit responsive to the digital output signal to compensate for asymmetrical qualities of the analog input signal, if present, and generate a timing signal for said ADC; and
a filter responsive to the digital output signal to generate a filtered signal,
wherein said timing generation and compensation circuit comprises a slicer bias loop that compensates for the asymmetrical qualities present in the digital output signal.

2. The circuit according to claim 1 wherein said slicer bias loop comprises a bias error detector and outputs to a first combiner.

3. The circuit according to claim 2 wherein said first combiner comprises a summer and said slicer bias loop further comprises a loop filter.

4. The circuit according to claim 3 wherein said loop filter comprises a second combiner and an accumulator.

5. The circuit according to claim 2 further comprising a slicer, and said bias error detector comprises a phase shifting circuit responsive to an output of said first combiner and a transition detector responsive to an output of said slicer.

6. The circuit according to claim 5 wherein said slicer is responsive to said first combiner.

7. The circuit according to claim 5 wherein said bias error detector further comprises a second combiner combining the output of said phase shifting circuit and a transition detection circuit.

8. The circuit according to claim 5 further comprising a phase detector responsive to said slicer and said first combiner to detect a phase of the digital output signal.

9. The circuit according to claim 8 further comprising a loop filter responsive to said phase detector to output the timing signal.

10. The circuit according to claim 8 wherein said phase detector includes a phase shifter and a combining circuit.

11. The circuit according to claim 2 wherein said bias error detector includes a transition detector and a second combiner.

12. The circuit according to claim 2 wherein said timing generation and compensation circuit comprises a limit equalizer responsive to said first combiner.

13. The circuit according to claim 12 wherein said timing generation and compensation circuit further comprises a slicer responsive to said limit equalizer to determine transitions.

14. The circuit according to claim 12 wherein said limit equalizer comprises first and second branches, the first branch including a limiter and a booster and the second branch including a phase rotator and a single delay.

15. The circuit according to claim 2 wherein said bias error detector comprises a phase shifter and a transition detector.

16. The circuit according to claim 1 further comprising a detector responsive to the filtered signal.

17. The circuit according to claim 16 wherein said detector comprises a viterbi detector.

18. The circuit according to claim 1 wherein said filter comprises a finite impulse response filter.

19. A method of generating a timing signal comprising the steps of:
   receiving an analog input signal and converting the analog input signal into a digital output signal;
   compensating for asymmetrical qualities of the analog input signal, if present, and generating a timing signal; and
   filtering the digital output signal to generate a filtered signal,
   wherein said step of compensating further comprises detecting a bias error to compensate for asymmetrical qualities present in the digital output signal.

20. The method according to claim 19 wherein said step of compensating further comprises loop filtering to compensate for asymmetrical qualities present in the digital output signal.

21. The method according to claim 19 wherein said step of compensating further comprises limit equalizing the digital signal to generate an equalized signal and slicing the equalized signal to generate a sliced signal.

22. The method according to claim 21 wherein said step of compensating further comprises phase detecting the digital signal and the sliced signal.

23. The method according to claim 22 wherein said step of compensating further comprises loop filtering and outputting the timing signal.

24. The method according to claim 19 further comprising the step of detecting the filtered signal.

25. The method according to claim 24 wherein said step of detecting the filtered signal comprises detecting with a viterbi detector.

26. The method according to claim 19 wherein said step of filtering the digital output signal comprises filtering with a finite impulse response filter.

27. A circuit comprising:
   first means for receiving an analog input signal and converting the analog input signal into a digital output signal;
   second means, responsive to the digital output signal, for compensating for asymmetrical qualities of the analog input signal, if present, and for generating a timing signal for said first means; and
   third means, responsive to the digital output signal, for generating a filtered signal,
   wherein said second means comprises a slicer bias loop that compensates for the asymmetrical qualities present in the digital output signal.

28. The circuit according to claim 27 wherein said slicer bias loop comprises means for detecting a bias error and first means for combining.

29. The circuit according to claim 28 wherein said first combining means comprises means for summing and said slicer bias loop further comprises means for loop filtering.

30. The circuit according to claim 29 wherein said loop filtering means comprises a second means for combining and an accumulator.

31. The circuit according to claim 28 further comprising a slicer, and wherein said means for detecting a bias error comprises means, responsive to an output of said first combining means, for phase shifting and means, responsive to an output of said slicer, for detecting transitions.

32. The circuit according to claim 31 wherein said slicer is responsive to said first combing means.

33. The circuit according to claim 31 wherein said bias error detecting means further comprises a second means for combining the output of said phase shifting means and said transition detecting means.

34. The circuit according to claim 31 further comprising a phase detector responsive to said slicer and said first combining means to detect a phase of the digital output signal.

35. The circuit according to claim 34 further comprising a loop filter responsive to said phase detector to output the timing signal.

36. The circuit according to claim 34 wherein said phase detector includes a phase shifter and a combining circuit.

37. The circuit according to claim 28 wherein said bias error detecting means includes a single phase shifter with an absolute value output and a second means for combining.

38. The circuit according to claim 28 wherein said second means comprises a limit equalizer responsive to said first combining means.

39. The circuit according to claim 38 wherein said second means further comprises a slicer responsive to said limit equalizer to determine transitions.

40. The circuit according to claim 38 wherein said limit equalizer comprises first and second branches, the first branch including a limiter and a booster and the second branch including a phase rotator and a single delay.

41. The circuit according to claim 28 wherein said bias error detector comprises a phase shifter and a transition detector.

42. The circuit according to claim 32 further comprising fourth means for detecting the filtered signal.

43. The circuit according to claim 42 wherein said fourth means comprises a viterbi detector.

44. The circuit according to claim 27 wherein said third means comprises a finite impulse response filter.

45. A machine-readable medium comprising stored instructions, which, when executed by a processor cause the processor to generate a timing signal comprising:

first instructions for receiving an analog input signal and converting the analog input signal into a digital output signal;

second instructions, responsive to the digital output signal, for compensating for asymmetrical qualities of the analog input signal, if present, and for generating a timing signal; and third instructions responsive to the digital output signal for generating a filtered signal, wherein said second instructions further comprises instructions for detecting a bias error to compensate for asymmetrical qualities present in the digital output signal.

46. The machine-readable medium according to claim 45 wherein said second instructions further comprises instructions for loop filtering to compensate for asymmetrical qualities present in the digital output signal.

47. The machine-readable medium according to claim 46 wherein said second instructions further comprises limit equalizing responsive to the digital signal to generate an equalized signal and slicing the equalized signal to generate a sliced signal.

48. The machine-readable medium according to claim 47 wherein said second instructions further comprises phase detecting responsive to the digital signal and the sliced signal.

49. The machine-readable medium according to claim 45 wherein said second instructions further comprises filtering and outputting the timing signal.

50. The machine-readable medium according to claim 45 further comprising fourth instructions for detecting the filtered signal.

51. The machine-readable medium according to claim 50 wherein said fourth instructions comprises detecting with a viterbi detector.

52. The machine-readable medium according to claim 45 wherein said third instructions for filtering comprises filtering with a finite impulse response filter.

* * * * *